US008593170B2

(12) United States Patent
Van der Plas et al.

(10) Patent No.: US 8,593,170 B2
(45) Date of Patent: Nov. 26, 2013

(54) METHOD AND DEVICE FOR TESTING TSVS IN A 3D CHIP STACK

(75) Inventors: Geert Van der Plas, Leuven (BE); Erik-Jan Marinissen, Leuven (BE); Nikolaos Minas, Kessel-Lo (BE); Paul Marchal, Blanden (BE)

(73) Assignee: IMEC, Leuven (BE)

( * ) Notice: Subject to any disclaimer, the term of this patent is extended or adjusted under 35 U.S.C. 154(b) by 439 days.

(21) Appl. No.: 12/891,658

(22) Filed: Sep. 27, 2010

(65) Prior Publication Data

US 2011/0102011 A1 May 5, 2011

Related U.S. Application Data

(60) Provisional application No. 61/246,458, filed on Sep. 28, 2009.

(30) Foreign Application Priority Data

Oct. 5, 2009 (EP) ..................... 09172258

(51) Int. Cl.
*G01R 31/02* (2006.01)
*G01R 31/26* (2006.01)
*G01R 27/28* (2006.01)
*H03K 19/003* (2006.01)
*H03K 19/00* (2006.01)

(52) U.S. Cl.
USPC ............... 324/762.03; 324/762.06; 702/117; 326/10; 326/16

(58) Field of Classification Search
CPC .................. G01R 31/2853; G01R 31/318513; G01R 31/31855

USPC ....................................... 324/762.03
See application file for complete search history.

(56) References Cited

U.S. PATENT DOCUMENTS 8,063,654 B2* 11/2011 Rahman et al. .......... 324/762.03
8,232,115 B2* 7/2012 Ding et al. ...................... 438/17

(Continued)

OTHER PUBLICATIONS

F. Liu, R. R. Yu, A. M. Young, J. P. Doyle, X. Wang, L. Shi 1 and others, A 300-mm Wafer-Level Three-Dimensional Integration Scheme Using Tungsten Through-Silicon Via and Hybrid Cu-Adhesive Bonding, This paper appears in:Electron Devices Meeting, 2008. IEDM 2008. IEEE International, Conference Publications, Date of Conference: Dec. 15-17, 2008.*

(Continued)

*Primary Examiner* — Jermele M Hollington
*Assistant Examiner* — Christopher McAndrew
(74) *Attorney, Agent, or Firm* — Knobbe, Martens Olson & Bear LLP

(57) ABSTRACT

A method and device for testing through-substrate vias (TSVs) in a 3D chip stack are disclosed. In one aspect, the 3D chip stack includes at least a first die having a first electrical circuit and a second die having a second electrical circuit. The first die further includes at least one first TSV for providing electrical connection between the first electrical circuit and the second electrical circuit. The first die further includes test circuitry and at least one second TSV electrically connected between the first TSV and the test circuitry. The electrical connection between the first TSV and the second TSV is made outside the second die. In one aspect, this allows testing the first TSV in the first die even if the second die is not provided with dedicated test circuitry.

18 Claims, 7 Drawing Sheets

(56) References Cited

U.S. PATENT DOCUMENTS

| | | | |
|---|---|---|---|
| 8,344,749 B2* | 1/2013 | Stillman et al. | 324/762.02 |
| 2003/0008424 A1* | 1/2003 | Kajiwara et al. | 438/18 |
| 2003/0085461 A1* | 5/2003 | Sakiyama et al. | 257/700 |
| 2006/0001176 A1* | 1/2006 | Fukaishi et al. | 257/777 |
| 2007/0138619 A1* | 6/2007 | Shinagawa et al. | 257/700 |
| 2008/0048706 A1* | 2/2008 | Shimizume et al. | 324/765 |
| 2009/0039491 A1* | 2/2009 | Kim et al. | 257/686 |
| 2010/0060310 A1* | 3/2010 | Laisne et al. | 326/10 |
| 2010/0295600 A1* | 11/2010 | Kim et al. | 327/365 |
| 2010/0332177 A1* | 12/2010 | Wu et al. | 702/117 |
| 2011/0042795 A1* | 2/2011 | Knickerbocker | 257/686 |
| 2011/0050303 A1* | 3/2011 | Ma | 327/158 |
| 2011/0079924 A1* | 4/2011 | Suh | 257/777 |
| 2011/0148469 A1* | 6/2011 | Ito et al. | 327/77 |
| 2013/0073907 A1* | 3/2013 | Han | 714/32 |
| 2013/0093455 A1* | 4/2013 | Whetsel | 324/762.03 |

OTHER PUBLICATIONS

Kang et al. 8Gb 3D DDR3 DRAM Using Through-Silicon-Via Technology, Solid-State Circuits Conference—Digest of Technical Papers, ISSCC'09, Paper 7.2, pp. 130-131, Feb. 8-12, 2009.

Lewis et al. Testing Circuit-Partitioned 3D IC Designs, ISVLSI '09 Proceedings of the 2009 IEEE Computer Society Annual Symposium on VLSI, pp. 139-144, May 13, 2009.

European Search Report dated Dec. 1, 2009 for EP Application No. 09172258.

* cited by examiner

FIG. 1 – Prior art

METHOD AND DEVICE FOR TESTING TSVS IN A 3D CHIP STACK

CROSS REFERENCE TO RELATED APPLICATIONS

This application claims priority under 35 U.S.C. §119(e) to U.S. provisional patent application 61/246,458, filed on Sep. 28, 2009, which application is hereby incorporated by reference in its entirety.

BACKGROUND OF THE INVENTION

1. Field of the Invention

The present invention relates to the field of three-dimensional stacking of semiconductor chips. Embodiments of the present invention provide the opportunity to fully test a TSV-based interconnect while only one of two tiers is under design control of a stack manufacturer.

2. Description of the Related Technology

The semiconductor industry is on an ongoing quest to integrate more functionality into a smaller form factor with increased performance, lower power and reduced cost. Traditionally, only two-dimensional planes were used for this: through conventional CMOS scaling, multiple IP cores in a single die (system-on-chip, SoC), multiple dies in a single package (multi-chip package, MCP) and multiple ICs on a printed circuit board (PCB). More recently, also the third, vertical dimension started to become exploited: system-in-package (SiP), in which multiple naked dies are vertically stacked in a single IC package, and interconnected by means of wire-bonds to the substrate; and package-on-package (PoP), in which multiple packaged chips are vertically stacked.

Three-dimensional (3D) stacking of chips is a hot research item, as it promises higher transistor densities and smaller footprints of electronic products. The latest evolution in this list of innovations is the so-called three-dimensional stacked IC (3D-SIC); a single package containing a vertical stack of naked dies which are interconnected by means of through-substrate-vias (TSVs). 3D stacking based on through-substrate-vias (TSVs) offers the benefits of more functionality, higher bandwidth and performance at smaller sizes, alongside lower power consumption and cost; and this even in an era in which conventional feature-size scaling becomes increasingly difficult and expensive. TSVs provide, as their name indicates, an electrical connection from the active frontside (face) of a semiconductor die through the semiconductor substrate to the back-side. TSVs are conducting nails which stick out of the back-side of a thinned-down die, which allow that die to be vertically interconnected to another die. TSVs are high-density, low-capacity interconnects compared to traditional wire-bonds, and hence allow for much more interconnects between stacked dies, and these interconnects can operate at higher speeds and lower power dissipation. TSVs allow to interconnect multiple vertically stacked dies with each other.

Like all ICs, also these new TSV-based 3D-SICs need to be tested for manufacturing defects, in order to guarantee sufficient outgoing product quality to a customer. Chip stacks should be delivered fault free as much as possible. In 3D chip stacking, the TSVs typically carry all interconnect signals between two dies, and hence are quite critical. Both the TSV manufacturing process, as well as the bonding process are delicate, and hence the TSV-based interconnects are prone to defects, such as for example opens and shorts.

Conventional test solutions include boundary scan testing, and require control and observation of special design-for-test (DfT) features or circuitry. If the dies on both ends of the TSVs are, at design time, under full control of the 3D chip stack designer, special Design-for-Test features can be added to the design of both top and bottom die that allow controllability and observability of the TSV, in order to fully test it. An alternative approach is that both tiers comprise control and/or observe DfT features, whereby the DfT features in the die which is not under control of the stack manufacturer are as desired or expected by the stack manufacturer, either by agreement, by chance, or by standardization. The DfT features in all tiers can be designed to co-operate. Once available, this circuitry reduces the test problem to an interconnect test problem, for which in literature many sets of test patterns are available. An example of a DfT implementation is illustrated in FIG. 1. A first die 10, also called bottom die, is provided with functional TSV connections 11a, 11b. The first die 10 is designed for being connected, via the TSV connections 11a, 11b, to corresponding bond pads 12 on a second die 13, also called top die. Special design for test features 14a, 14b are provided both in the first die 10 and in the second die 13. In the first die 10, a first input port TDI1 is provided for applying electrical input signals to test circuitry 14a for driving TSV connections 11a, and a first output port TDO1 is provided for sensing electrical signals emanating from the TSV connections 11b. A second input port TDI2 is provided for applying electrical input signals to test circuitry 14b for driving TSV connections 11b, and a second output port TDO2 is provided for sensing electrical signals emanating from the TSV connections 11a. Furthermore, a test data select port is provided for applying select signals to multiplexers in the design for test features 14a, 14b.

Unfortunately it is often the case that one of the dies is not under control of the stack designer, e.g. because it is an already-existing die. Hence the stack designer cannot provide special design-for-test features in the die not under his control, neither can these features be added as an afterthought. Nevertheless, the TSV-based interconnects need to be tested. A particular example thereof is memories, which typically do not have features for boundary scan testing.

Kang et al. disclose, in "8 Gb 3D DDR3 DRAM Using Through-Silicon-Via Technology", ISSCC'09, Paper 7.2, pp. 130-131, a TSV repair scheme to increase the assembly yield. A number of redundant TSVs is allocated to a group of TSVs. If one of the TSVs fails, it is replaced by one of the redundant TSVs. No distinction is made between regular and redundant TSVs. If a failure occurs at a TSV, the remaining TSVs are all shifted to the neighboring ones, so a failed TSV is always repaired with a neighboring TSV. In order to determine that a TSV fails, a test is needed, but the document does not specify how TSVs are tested.

SUMMARY OF CERTAIN INVENTIVE ASPECTS

Certain inventive aspects relate to a method and device for testing TSVs electrically interconnecting dies, especially in case one of the dies is not under control of the stack designer.

In a first aspect, the present invention provides circuitry for testing functionality of at least one through-substrate via in a 3D chip stack comprising a first die and a second die. The circuitry comprises a first die comprising at least one first through-substrate via for providing electrical connection between an electrical circuit in the first die and an electrical circuit in the second die. The first die furthermore comprises test circuitry, and a second through-substrate via for each first through-substrate via to be tested, the second through-substrate via being electrically connected to the test circuitry. The first and the second through-substrate vias are arranged for being electrically connected to each other so as to form a feedback loop from the test circuitry back to the test circuitry.

It is an advantage of embodiments of this aspect of the present invention that all test circuitry can be present in the first die, which the manufacturer may have under design control. Hence the first die according to embodiments of the present invention, part of the circuitry for testing functionality of at least one through-substrate via, may be connected to any suitable second die, which does not need specific provisions for testing, while the interconnection through a through-substrate via between the first die and the second die is still testable.

In particular embodiments of the present invention, one second through-substrate via is provided for each first through-substrate via to be tested. Each first through-substrate via may be arranged for being connected to a different second through-substrate via. The first through-substrate vias and the second through-substrate vias may be arranged for being electrically connected in pairs. The duplication of the through-substrate vias as is performed in accordance with this embodiment of the present invention provides improved mechanical stability to the chip stack.

Embodiments of the present invention include situations in which for one, some or all of the first through-substrate vias an second through-substrate via for testing may be provided.

In circuitry according to embodiments of the present invention the at least one first through-substrate via may be conceived for driving the test circuitry. The at least one second through-substrate via may be conceived for capturing signals from the test circuitry.

In circuitry according to certain embodiments of the present invention, the at least one first through-substrate via may be conceived for capturing signals from the test circuitry. The at least one second through-substrate via may be conceived for driving the test circuitry. This latter scenario makes sense for those functional (=first) through-substrate vias which normally transport data from second to first die, and where it is not desired to add tri-stateable driver circuitry to reverse their functional direction during test.

In embodiments of the present an electrical connection between a first through-substrate via and a second through-substrate via may be made outside the first die. For example the at least one second through-substrate via may be electrically connected to the at least one first through-substrate via by means of a seed layer and/or plated metal between the first and the second through-substrate vias, by means of a direct metal-metal bond, for example a Cu—Cu bond, or by means of micro-bumps.

In a second aspect, the present invention provides a 3D chip stack comprising at least a first die and a second die, the first die comprising a first electrical circuit and the second die comprising a second electrical circuit, wherein the first die furthermore comprises at least one first through-substrate via for providing electrical connection between the first electrical circuit in the first die and the second electrical circuit in the second die, test circuitry and at least one second through-substrate via electrically connected between the at least one first through-substrate via and the test circuitry. The electrical connection between the at least one first through-substrate via and the at least one second through-substrate via is made outside the second die. In particular embodiments of the present invention, the electrical connection may be made at a surface of the second die, for example at a major surface of the second die facing the first die in the stack.

A 3D chip stack according to embodiments of the present invention may comprise at least one further die comprising at least one further functional through-substrate via for providing electrical connection between an electrical circuit in this further die and an electrical circuit in one of the first or second dies, and at least one further additional through-substrate via electrically connected between the at least one further functional through-substrate via and further test circuitry in the further die. This way, a stack of n dies may be made, n being an integer larger than one, of which one is not under design control of the manufacturer of the stack, while still all through-substrate via connections can be tested.

In a 3D chip stack according to embodiments of the present invention, the second die may comprise at least one dedicated test structure, there being at least one through-substrate via in the first die which is connected to the at least one dedicated test structure. This way, a combination of prior art testing and testing according to embodiments of the present invention may be achieved.

In a further aspect, the present invention provides the use of a 3D chip stack according to embodiments of the present invention, wherein in test mode the at least one second through-substrate via acts as a feedback through-substrate via, while in functional mode the at least one second through-substrate via acts as a backup through-substrate via. This may be obtained by providing a suitable switch so that the at least one second through-substrate via can be disconnected from the test circuitry and switched from a series connection to a parallel connection with the corresponding at least one first through-substrate via.

In yet another aspect, the present invention provides a method for testing a through-substrate via in a 3D chip stack comprising a first die and a second die. The first die comprises at least one first through-substrate via for providing electrical connection between a first electrical circuit in the first die and a second electrical circuit in the second die. The method comprises applying an input test signal to a first through-substrate via and sensing an output test signal from a second through-substrate via electrically connected to the first through-substrate via outside the second die, for example at a surface thereof, or vice versa, i.e. applying an input test signal to a second through-substrate via and sensing an output test signal from a first through-substrate via electrically connected to the second through-substrate via outside the second die.

In particular embodiments of the present invention, a solution for testing 3D chip stacks is provided that enables testing of the TSV-based interconnects for manufacturing defects, even if proper test circuitry in one of the dies is absent.

Particular and preferred aspects of the invention are set out in the accompanying independent and dependent claims. Features from the dependent claims may be combined with features of the independent claims and with features of other dependent claims as appropriate and not merely as explicitly set out in the claims.

Certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Figure 1:
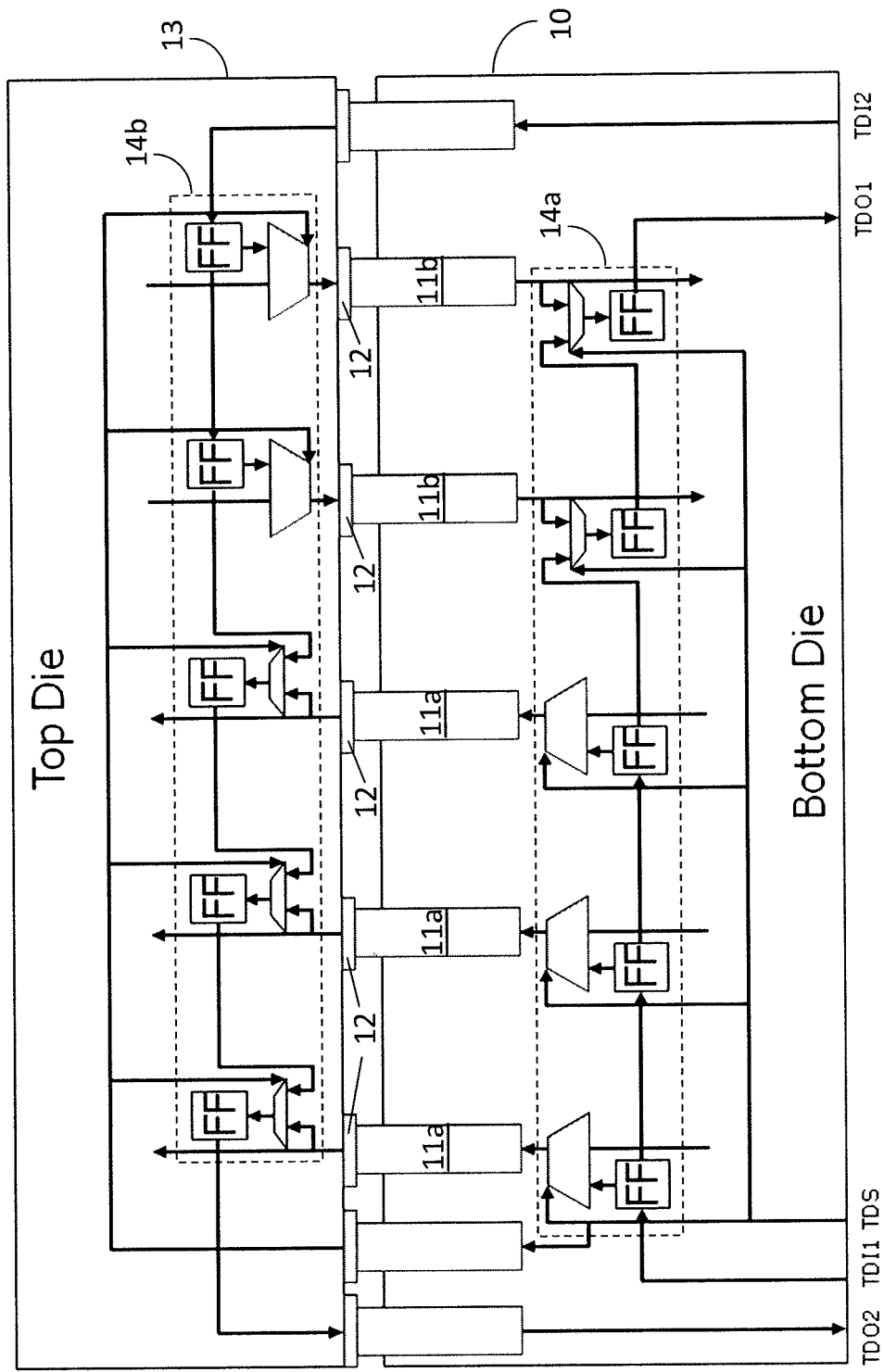
FIG. 1 illustrates a first and a second die, electrically interconnected by means of TSVs, wherein both the first and the second die are provided with prior art design-for-test features as known in the art.
Figure 2:
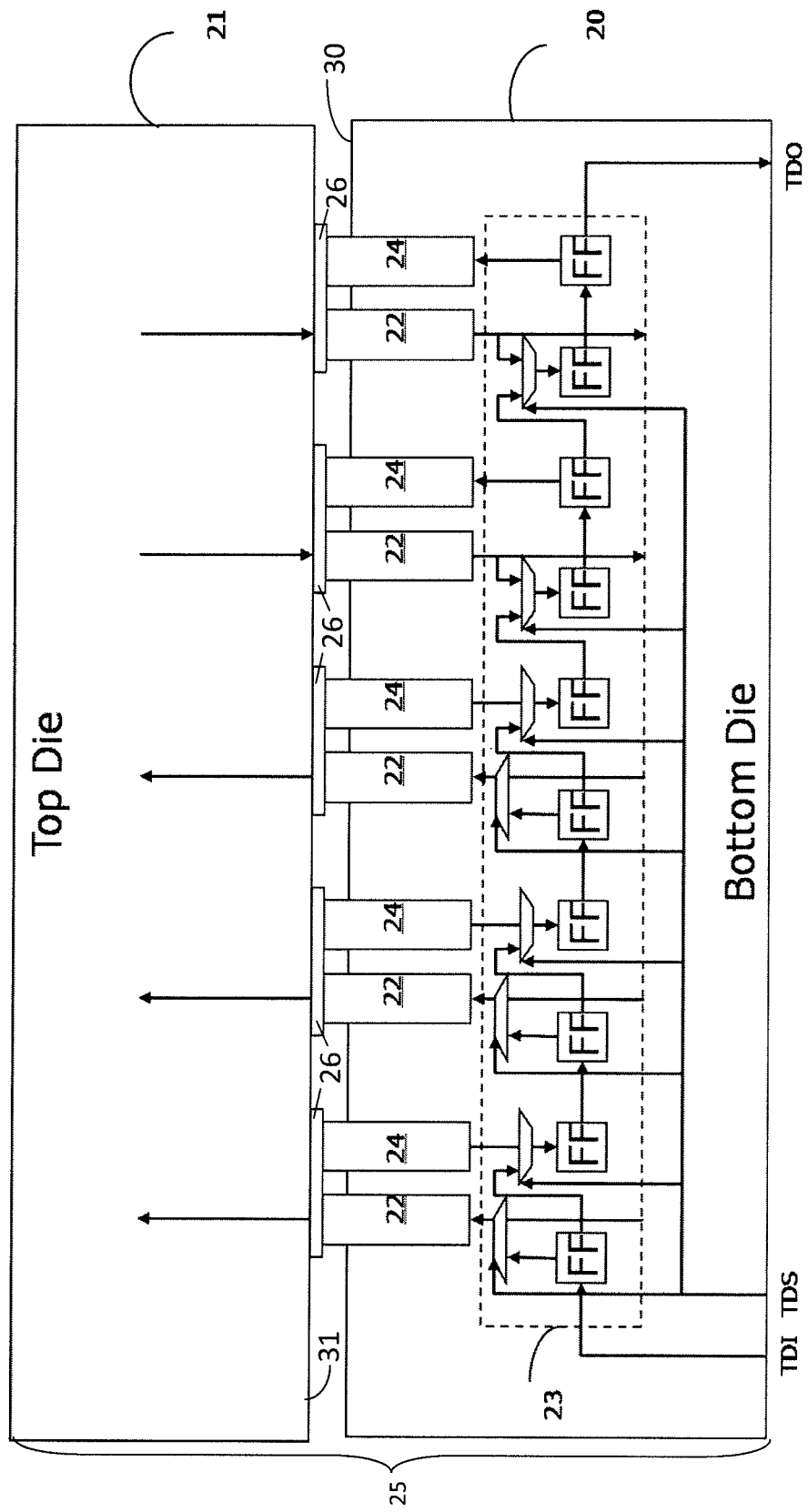
FIG. 2 illustrates a stack comprising a first die and a second die electrically interconnected by means of functional TSVs, wherein the die comprising the functional TSVs is also provided with test circuitry for testing the functional TSVs and supplementary TSVs electrically connected to the test circuitry, functional and supplementary TSVs being electrically connected to each other so as to form a feedback loop from the test circuitry and back, according to a first embodiment of the present invention.

The drawings are only schematic and are non-limiting. In the drawings, the size of some of the elements may be exaggerated and not drawn to scale for illustrative purposes.

Any reference signs in the claims shall not be construed as limiting the scope of the present invention.

In the different drawings, the same reference signs refer to the same or analogous elements.

DETAILED DESCRIPTION OF CERTAIN ILLUSTRATIVE EMBODIMENTS

At least one functional through-substrate-via (TSV) 22 for electrically connecting two dies 20, 21 is assumed, of which a first die 20 is under control of the manufacturer providing the TSV connection(s) 22 and a second die 21 is not designed by or under design control of the manufacturer providing the TSV connection(s) 22. Nevertheless, that manufacturer needs to be able to test his TSV connection(s) 22. In particular embodiments of the present invention, the TSVs are through-silicon-vias.

In accordance with a first embodiment of the present invention, the manufacturer provides, on the die 20 under his control, dedicated circuitry for testing the functionality of the functional TSV connection(s) 22 on that die 20. Functional TSVs 22 are TSVs designed for conducting electrical signals from one die to another when using the die stack 25 in its normal operation. The dedicated circuitry for testing comprises test circuitry 23 and for each functional TSV 22 a second TSV 24, the second TSV 24 being electrically connected to the test circuitry 23. The functional and the second TSVs are arranged for being electrically connected to each other so as to form a feedback loop from the test circuitry 23 in the first die 20 back to that test circuitry 23. In some embodiments of the present invention, for each functional TSV 22, a second TSV 24 is provided. In particular embodiments of the present invention, each second TSV 24 is associated to exactly one functional TSV. Functional TSV-second TSV pairs may be formed. In particular embodiments of the present invention, where a 3D chip stack is actually formed, an electrical connection between the at least one functional TSV 22 and the at least one second TSV 24 is made at a surface 31 of the second die 21 facing the first die 20 in the stack 25.

Hence a basic idea behind one embodiment of the present invention is to extend an already planned (functional) TSV 22 with an additional, extra TSV 24. The functional TSV 22 and the additional TSV 24 are arranged suitably for being electrically connected to one another, for example at the side of the second die 21 which, when assembled into a stack 25, faces the first die 20. The suitable arranging of the functional TSVs 22 and additional TSVs 24 may include distributing them suitably over the substrate, e.g. placing functional TSVs 22 and additional TSVs 24 close enough to each other for allowing an electrical connection between them to be applied.

Such electrical connection 26 may be made in any suitable way, e.g. by providing electrical conductive material on the surface of the second die 21 between the TSV 22 and the additional TSV 24, for example by means of Cu plating. As an example, a first implementation of such electrical connection between a functional TSV 22 and an extra TSV 24 is given below. In the context of direct Cu—Cu TSV bonding, the bottom die 20 may contain Cu TSVs 22, 24 and the top die may have Cu TSV landing pads 26. In an example process, the TSV tips are cylindrical with a diameter of e.g. about 5 µm; the TSV landing pads 26 are square, e.g. $9 \times 9$ µm$^2$; the minimum pitch between two TSVs is e.g. about 10 µm. A possible way to implement the electrical connection between two TSVs 22, 24 is to make the Cu TSV landing pad 26 larger, such that two TSVs, more particularly a functional TSV 22 and an extra TSV 24 can land on a single pad 26. With the minimum TSV pitch as indicated in the present example, this pad would for example be about $9 \times 19$ µm$^2$.

In embodiments of the present invention (not illustrated), the electrical connection between the functional TSV 22 and the supplementary TSV 24 is made at the surface of the first die, more particularly for example at the surface facing the second die when both dies are placed in a stack 25.

The testing of the at least one functional TSV 22 may be performed by driving the functional TSV 22 and by observing the signals at the output of the at least one additional TSV 24. The proper connection of the functional TSV 22 can now be tested by forcing test stimuli over the functional TSV 22 and sensing the corresponding responses via the new, additional TSV 24. In alternative embodiments, the testing of the at least one functional TSV 22 may be performed by driving the additional TSV 24 and by sensing the corresponding responses at the functional TSV 22. The TSV-based interconnect 22, 24 is essentially just an electrical "wire", which has no sense of direction. It is the control and observe circuitry in the dies 20, 21, i.e. the test circuitry 23, that determines the direction of the interconnect. The interconnects will typically be uni-directional, although also bi-directional interconnects can be envisioned. Typically, it makes sense to use the same functional direction also for testing, simply because then no additions to driver circuitry need to be made. However, it is possible to test in the reverse of the functional direction; it just requires more complex drive and capture circuitry.

According to embodiments of the present invention, test signals driving a functional TSV 22 do not need to go into the second die 21, but are transferred, via the electrical connection between the functional TSV 22 and the supplementary TSV 24, from an input port TDI on the first die to an output port TDO on the first die.

It is an advantage of embodiments of the present invention that it enables to test the integrity of a TSV-based connection between two dies 20, 21, of which one, in the embodiment illustrated die 21, has a fixed and unchangeable design that does not allow the manufacturer of the die 20 comprising the functional TSV 22 to provide test circuitry in that die 21. This advantage is mainly achieved by implementing the additional TSV 24 which provides a feedback loop to the die 20 under design control. All test circuitry 23 is provided into the die 20 under design control. Where in prior art devices the design-for-test hardware is divided, for each functional TSV, in a first driving part in one die, and a second sensing part in another die, in accordance with embodiments of the present invention, both the driving part and the sensing part of the hardware for testing is provided in one and the same die, more particularly in the die comprising the functional TSVs.

TSV processing technologies allow to make very many TSVs with high densities, often many more than can be functionally utilized in a circuit. Hence, it is an advantage that the at least one additional TSV 24 can typically be implemented with zero or negligible extra cost. Actually, the at least one additional TSV might even have a benefit, as sometimes dummy TSVs are implemented to (1) improve the mechanical strength between both stacked dies 20, 21; and (2) uniform TSV densities are good to optimize the processing time for copper plating of TSVs.

The sensing circuitry connected to the additional TSV might cause additional electrical load on the functional TSV 22. However, the design-for-test circuitry can be designed such that it can be disconnected after testing, for example by inserting a tri-stabeable driver or pass-gate.

Figure 3:
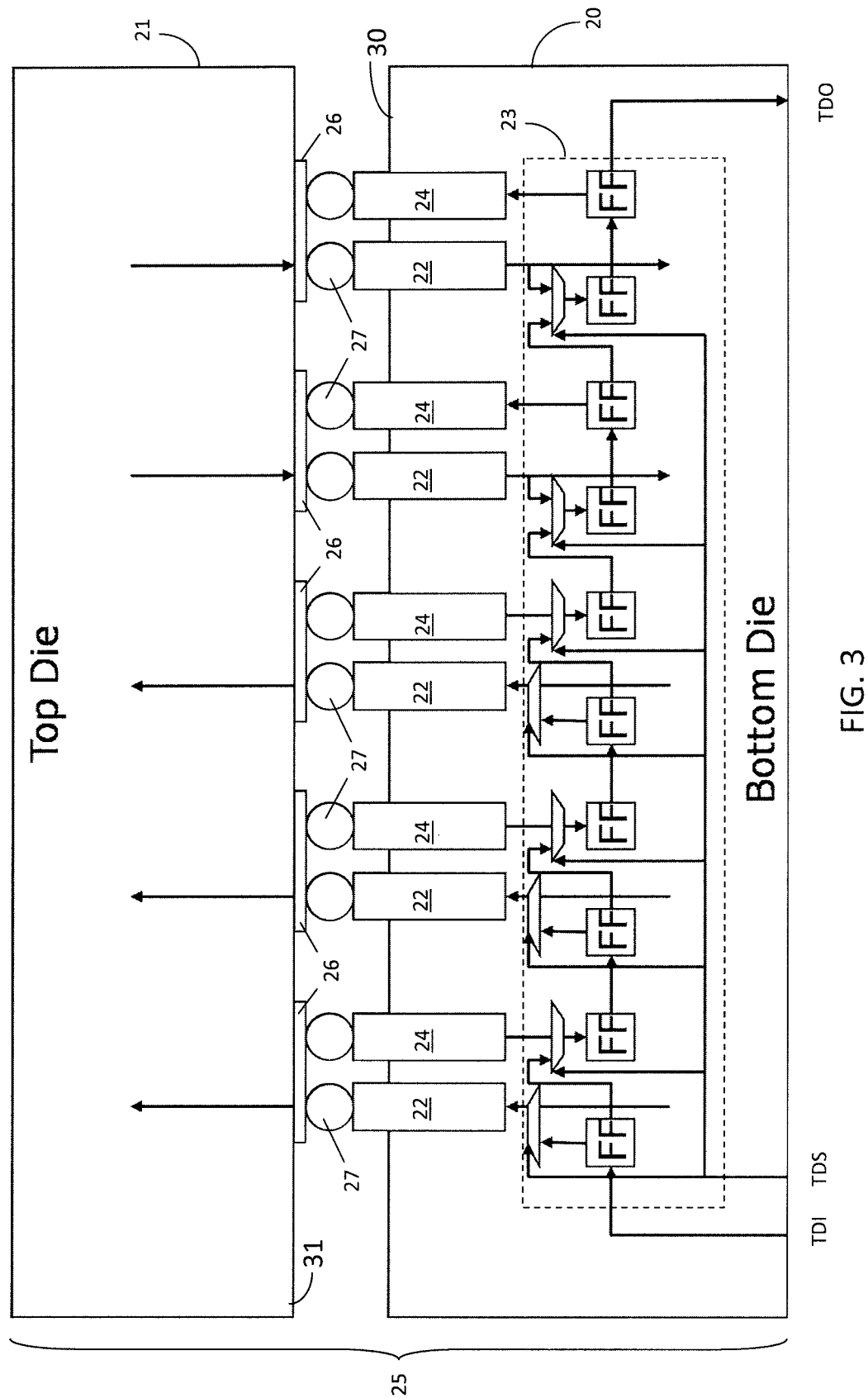
FIG. 3 illustrates a stack according to a second embodiment of the present invention, comprising a first and a second die, the first die comprising, besides the functional TSVs electrically interconnecting the first and second dies, test circuitry and supplementary TSVs electrically connected between the test circuitry and the TSVs, the electrical connection between the TSVs and the supplementary TSVs including micro-bumps.

An example of a second embodiment of the present invention is illustrated in FIG. 3. In this case, a first die 20 under control of the stack manufacturer and a second die 21 not under his or her control are stacked together so as to form stack 25. The electrical connection between features on the first die 20 and features on the second die 21 is provided by means of at least one functional TSV 22 provided in the first die 20, connectable to corresponding bond pads 26 on the second die 21.

In the first die 20, which is under control of the stack manufacturer, design-for-test hardware 23 is added, such that the at least one functional TSV 22 can be tested for manufacturing defects. Again in this embodiment, in order to obtain the testability, at least one supplementary TSV 24 is provided in the first die 20. This at least one supplementary TSV 24 is electrically connected in between the at least one functional TSV 22 and the design-for-test hardware.

A difference between the first and the second embodiment of the present invention is that according to the second embodiment, the at least one functional TSV 22 and the at least one supplementary TSV 24 are electrically connected by means of microbumps 27 between the TSVs 22, 24 and the bond pads 26. In this case, in order to obtain the electrical connection between a functional TSV 22 and an extra TSV 24, the bottom die 20 may comprise microbumps 27, for example Cu—Sn microbumps, on top of the functional TSVs 22 and on top of the additional TSVs 24, and the top die 21 may comprises a microbump pad 26, for example a Cu microbump pad. In an example process for this, the TSVs 22, 24 are cylindrical with a diameter of e.g. about 25 μm and a pitch of e.g. about 40 μm; the thickness of the Cu microbump pad is e.g. about 5 μm, and the Sn layer of the microbumps is e.g. about 3 μm thick. A possible way to implement the electrical connection between two TSVs 22, 24 is to make the Cu microbump pads 26 larger, say an oval or rectangle of e.g. about 65×25 μm².

According to embodiments of the present invention, for each to be tested functional TSV 22 an extra TSV 24 is provided, arranged for being electrically connected to the corresponding functional TSV 22 so as to form a feedback loop to the first die 20. According to other embodiments of the present invention, this is only performed for some of the functional TSVs 22, or even only for one of the functional TSVs 22.

Figure 4:
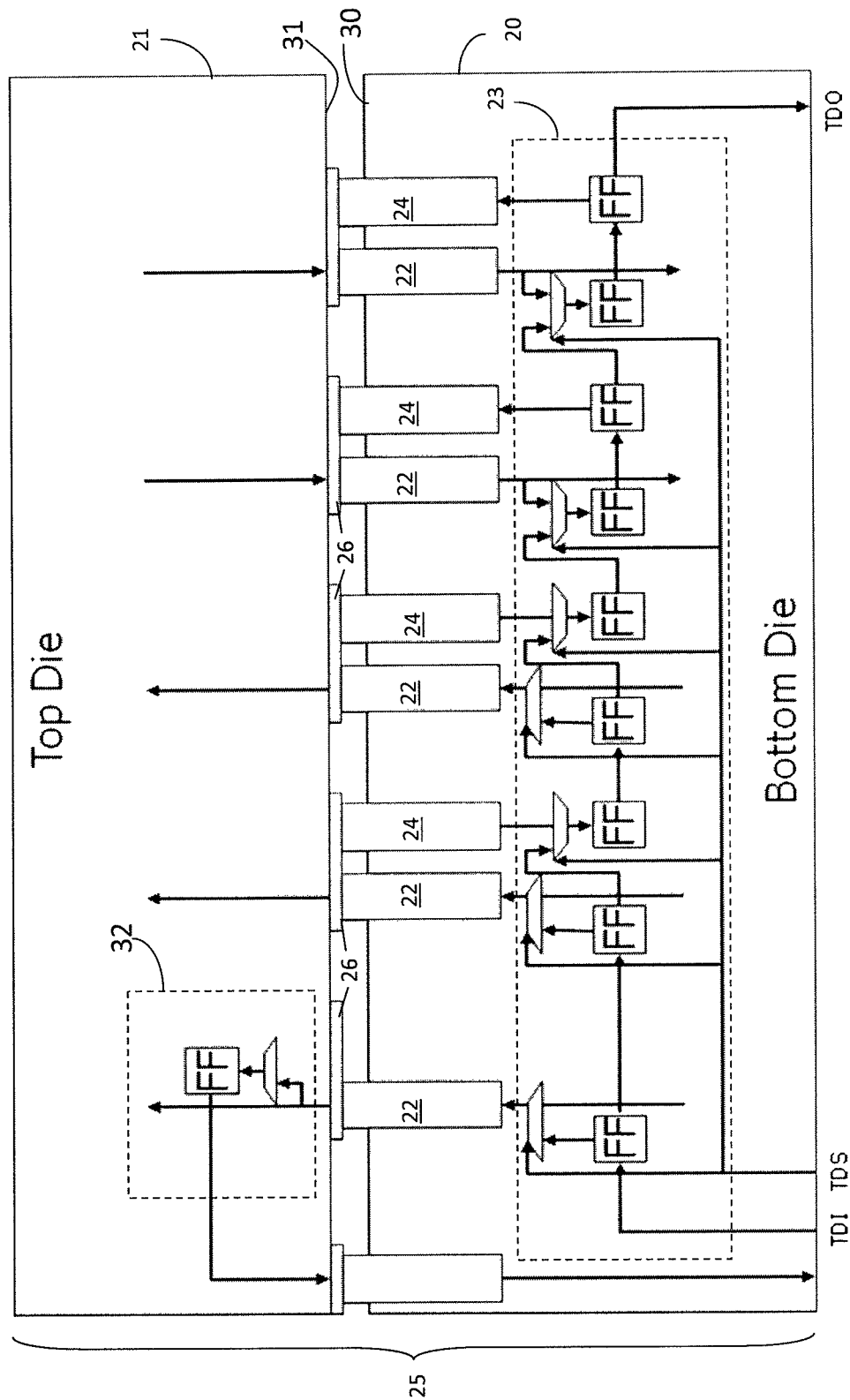
FIG. 4 illustrates a mixed test solution according to embodiments of the present invention, in which at least one TSV is tested by means of dedicated test circuitry provided in a die not under design control, and at least one other TSV is tested by means of a loop back TSV and test circuitry provided in the die which is under design control.

According to particular embodiments of the present invention, as illustrated in FIG. 4, a mix may be made of prior art test solutions and a test design incorporating the features of certain embodiments. In the embodiment illustrated in FIG. 4, a first die 20 and a second die 21 are stacked so as to form stack 25. The first die 20 comprises at least one first, functional TSV 22, for providing electrical connection between an electrical circuit (not illustrated in FIG. 4) in the first die 20 and an electrical circuit (not illustrated in FIG. 4) in the second die 21. As in the previous embodiments, the first die 20, which is the die under design control of the stack manufacturer, furthermore comprises test circuitry 23 and at least one second TSV 24 electrically connected to the test circuitry 23, and arranged for being electrically connected to a first, functional TSV 22 in the first die, so as to form a feedback loop from the test circuitry 23 and back to that test circuitry 23. In the stack, the electrical connection between the at least one first TSV 22 and the at least one second TSV 24 may be made at the surface 31 of the second die 21. However, in the embodiment illustrated, also at least one dedicated test structure 32 is provided in the second die 21, for testing one or more particular TSVs 22. For this or these particular TSVs 22, no additional TSV 24 forming a loop back to the first die 20 in accordance with embodiments of the present invention needs to be provided.

According to one embodiment of the present invention, on top of at least one additional TSV 24 according to embodiments of the present invention being present in the first die 20, such that it can be electrically connected to a functional TSV 22 in the first die 20, e.g. at a surface of the second die 21, one or more functional feed-throughs may be provided in the second die 21. In this case, the functional design of the second die 21 may be such that a signal emanating from a TSV 22 to be tested can be can be guided through the second die 21 (by means of the feed-through) towards another TSV in the first die 21, where it can be sensed. In particular designs of second dies 21, such feed-throughs may be present for some of the TSVs 22 to be tested. Embodiments of the present invention include a combination of testing of at least one functional TSV 22 by means of such feed-through, and testing of at least one other functional TSV 22 by means of an additional TSV 24 provided in the first die 20 and electrically connected between the functional TSV 22 and test circuitry 23 as explained with respect to other embodiments of the present invention.

Figure 5:
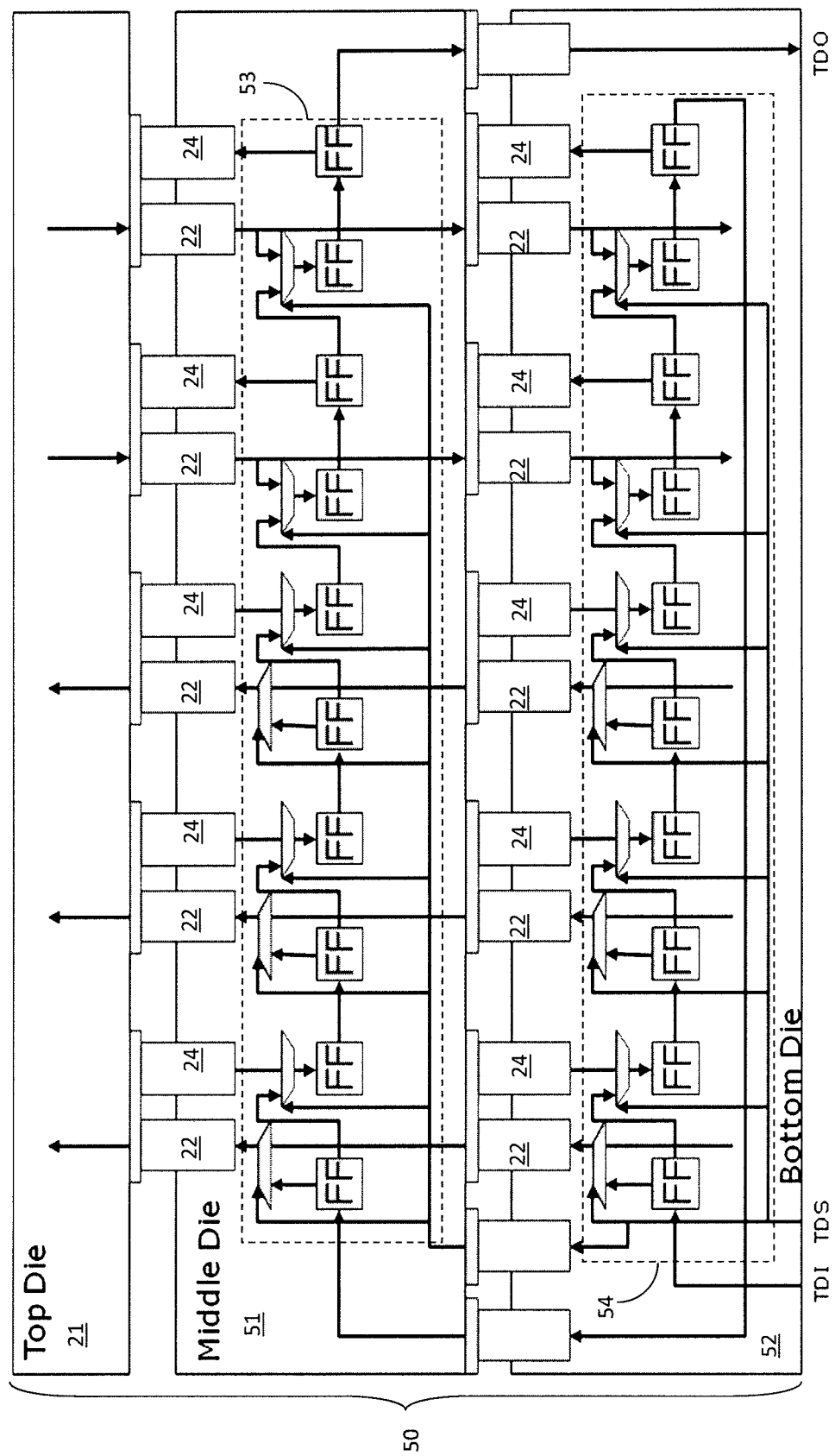
FIG. 5 illustrates a stack of three dies in accordance with embodiments of the present invention.

According to embodiments of the present invention, a plurality of dies may be stacked onto one another. At least one of the dies may be provided with supplementary TSVs electrically connected between the functional TSV and test circuitry. Preferably, all-but-one dies are under control of the stack manufacturer. An example of a stack 50 comprising three dies (n=3) is illustrated in FIG. 5. The top die 21 is not under design control of the stack manufacturer. The other dies 51, 52 in the stack 50 are, in accordance with embodiments of the present invention, provided with through-substrate vias 22 for providing electrical connection between an electrical circuit in a die 50, 51 one level higher in the stack 50 and an electrical circuit in the die 51, 52 itself. The dies 51, 52 under design control of the stack manufacturer comprise test circuitry 53, 54, and second through-substrate vias 24 for each first through-substrate via 22 to be tested. The second through-substrate vias are electrically connected to the test circuitry 53, 54 of the die 51, 52 they are part of, and the first and second through-substrate vias are arranged for being electrically connected to each other so as to form a feedback loop from the test circuitry 53, 54 back into that same test circuitry. The electrical connection between the first and second through-substrate vias arranged to form a feedback loop may be made as explained with regard to previous embodiments.

In one aspect of the present invention, a method is provided for manufacturing a stack 25 comprising at least a first 20 die and a second die 21, the first die 20 comprising at least one first TSV 22 for making electrical connection to the second die 21, test circuitry 23 adapted for testing the electrical functioning of the at least one TSV 22 and at least one second TSV 24 for each first TSV 22 to be tested, the at least one TSV 24 being electrically connected to the test circuitry 23, the at least one first TSV 22 and the one or more second TSVs 24 being arranged for being electrically connected to one another so as to form a feedback loop from the test circuitry 23 back to the test circuitry 23. The method comprises providing an electrical connection between the at least one first TSV 22 and one of the at least one second TSVs 24, for example by electrically connecting both to a bondpad 26 on the second die 21. The electrical connection between the TSVs 22, 24 and the bondpad 26 may be performed by either one of a direct metal-metal bonding (e.g. Cu—Cu bonding, Sn—Cu bonding), or by means of microbumps 27 between the TSVs 22, 24 and the bondpad 26.

In accordance with certain embodiments of the present invention, for a functional TSV 22 to be tested, an additional TSV 24 is provided which is arranged for being electrically connected to the functional TSV 22 so as to form a feedback loop back into the first die 20. In order to achieve such electrical connection, the additional TSV 24 may be provided close to the functional TSV 22, for example they may be implemented as physical neighbors. As an example, in a particular technology, TSVs 22, 24 can be processed at a minimum pitch of 10 μm. For micro-bumped TSVs 22, 24 as in FIG. 3, the minimum pitch is larger, simply because the microbumps 27 are larger and have an about 40 μm pitch of their own; in that case it is the microbumps 27 that determine the minimum TSV pitch, not the TSV processing itself.

It is an advantage of certain embodiments of the present invention that an electrical access is provided, by a feedback loop from the test circuitry 23 in the first die 20 through a functional TSV 22, through an additional electrical connection 26 mounted outside the second die 21, through an additional test TSV 24, back into the test circuitry 23 in the first die 20. This way, the stack manufacturer (or any other person) can test the functional TSVs 22 under his design control for failure, without having access to the design of the second die 21. This is independent from the exact manufacturing steps of TSVs (via-first, via-middle, via-last; orientation; bonding technology).

Figure 6:
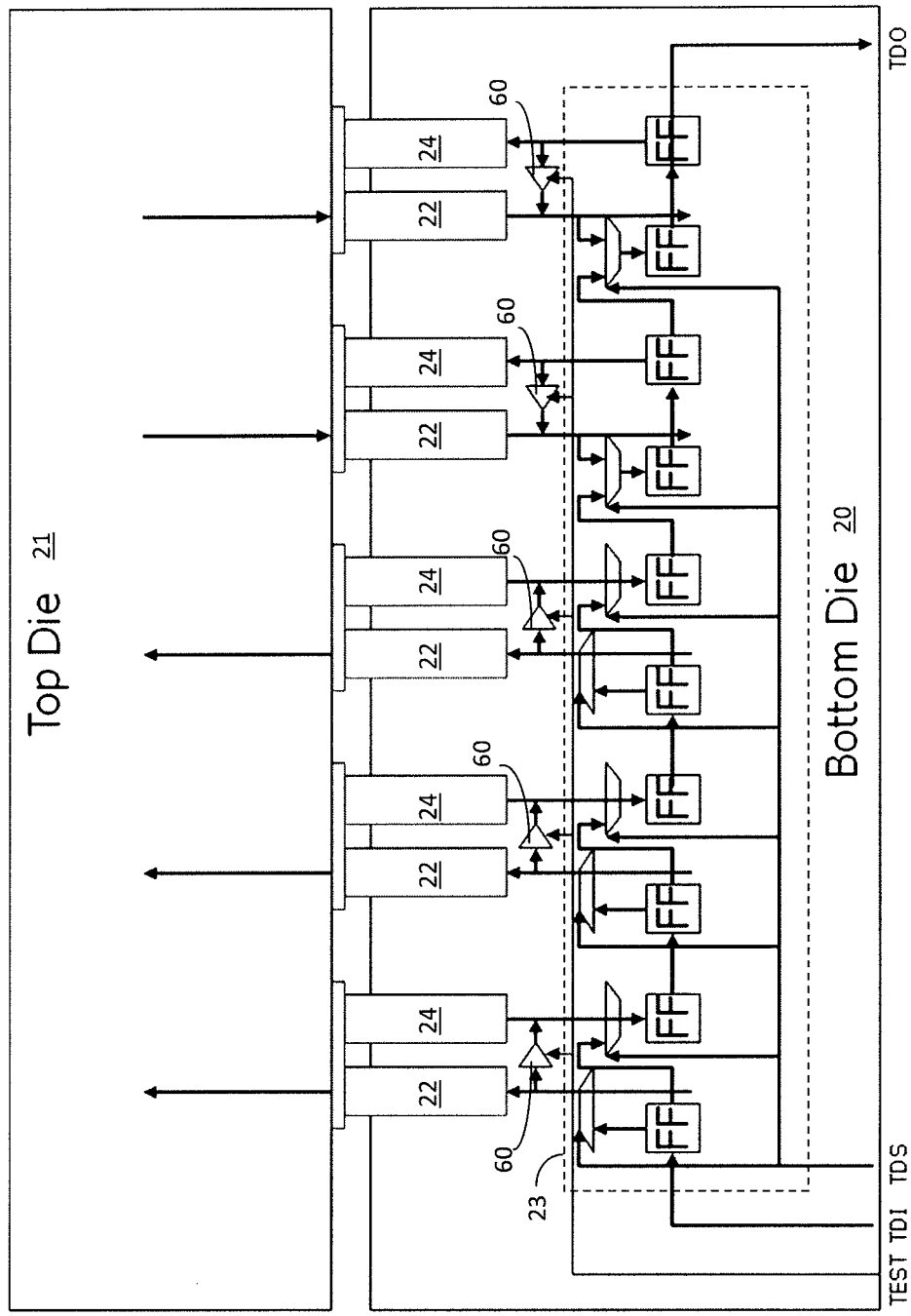
FIG. 6 illustrates a stack according to embodiments of the present invention provided with switches such that the at least one additional TSV, intended for forming a feedback loop for testing, may act as a backup TSV during functional mode of the stack.

It is an advantage of certain embodiments of the present invention that for at least one functional TSV 22, and preferably for most or even for all functional TSVs 22, an additional TSV 24 is provided for testing purposes. In test mode, this at least one additional TSV 24 acts as a feedback TSV. In particular embodiments of the present invention, such at least one additional TSV 24 may act as a backup TSV during functional mode of the stack 25. In this embodiment, suitable switches need to be provided to switch the additional TSV 24 in the actual functional circuit after testing. An example of such embodiment is illustrated in FIG. 6 in which three-state switches 60 are provided, arranged so that the at least one second through-substrate via 24 can be disconnected from the test circuitry 23 and switched from a series connection to a parallel connection with the corresponding at least one first through-substrate via 22. In another aspect of the present invention, a method is provided for testing a functional TSV 22 in a 3D chip stack 25 comprising a first die 20 and a second die 21. The first die 20 comprises at least one functional TSV 22 for providing electrical connection between an electrical circuit in the first die 20 and an electrical circuit in the second die 21. The method comprises applying an input test signal to a first TSV and sensing an output test signal from a second TSV electrically connected to the first TSV at a surface of the second die 21, whereby any one of the first or second TSVs is the functional TSV to be tested, and the other one is an additionally provided TSV forming an electrical loop back to the first die 20. Hence the input test signal may be applied either to the functional TSV 22 or to the additional TSV 24, and equally the output test signal may be sensed at the additional TSV 24, respectively the functional TSV 22.

In accordance with embodiments of the present invention, TSVs may have larger density compared to prior art. This may be advantageous for mechanical stability. Already in prior art devices, sometimes dummy TSVs are provided, for example for better processing, for mechanical stability, for heat conduction. Now these dummy TSVs need no longer be dummy TSVs, but can have an actual function in testing of the functional TSVs.

Figure 7:
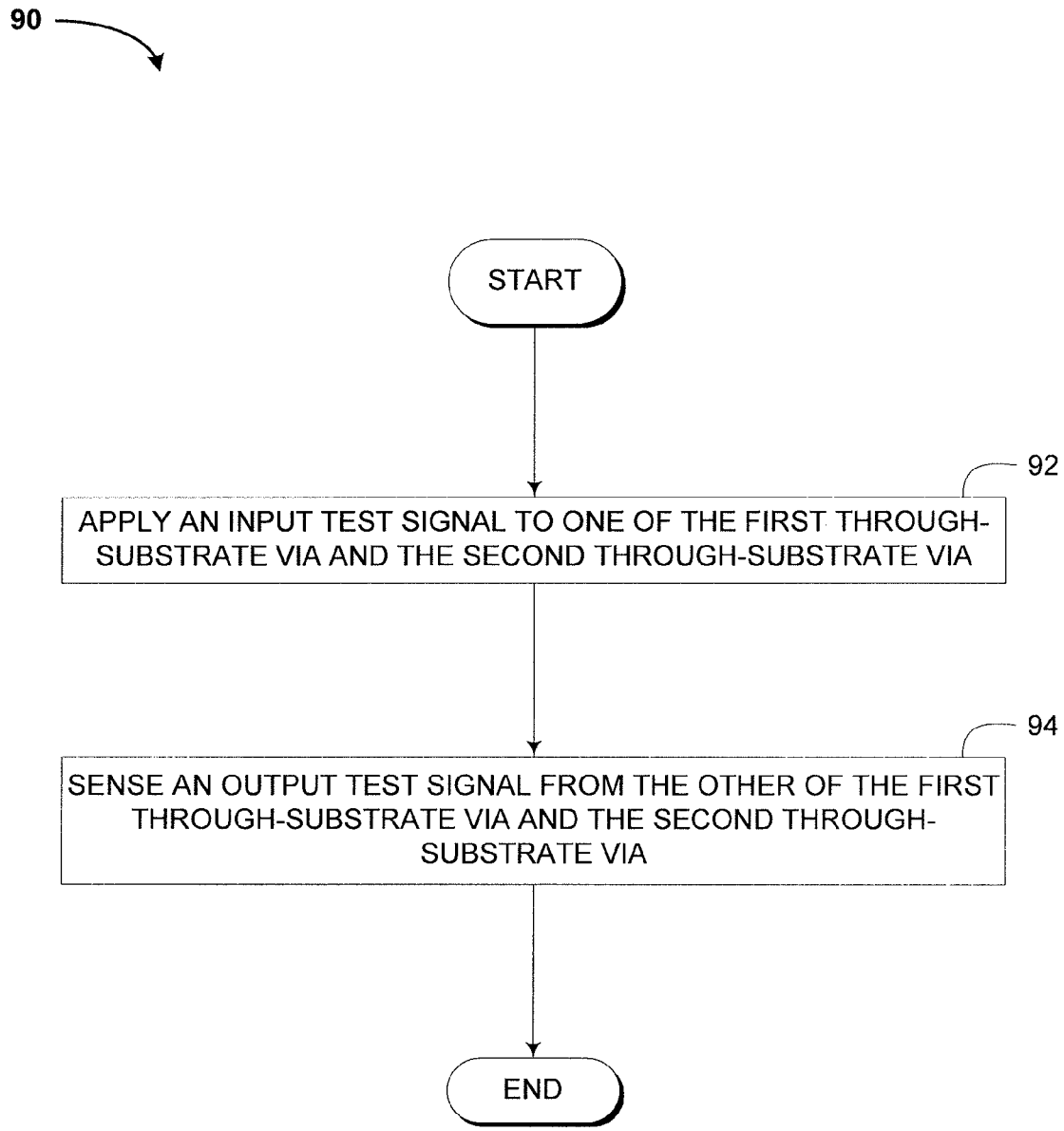
FIG. 7 shows a flowchart of one embodiment of a method of testing a through-substrate via in a 3D chip stack.

FIG. 7 shows a flowchart of one embodiment of a method of testing a through-substrate via in a 3D chip stack. The 3D chip stack may comprise a first die and a second die. The first die may comprise at least one first through-substrate via for providing electrical connection between a first electrical circuit in the first die and a second electrical circuit in the second die. The method 90 starts at a block 92, wherein an input test signal is applied to one of the first through-substrate via and the second through-substrate via. The first through-substrate via may be electrically connected to the second through-substrate via outside the second die. Next at a block 94, an output test signal is sensed from the other of the first through-substrate via and the second through-substrate via.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A device for testing functionality of at least one through-substrate via in a 3D chip stack, the device comprising:
    a first die and a second die, the first die comprising at least one first through-substrate via for providing electrical connection between an electrical circuit in the first die and an electrical circuit in the second die,
    wherein the first die further comprises a test circuit, and a second through-substrate via for each first through-substrate via to be tested, the second through-substrate via being electrically connected to the test circuit, and the first and the second through-substrate vias being arranged for being electrically connected to each other so as to form a feedback loop from the test circuit back to the test circuit, the feedback loop comprising at least the first and the second through-substrate vias and the test circuit.

2. The device according to claim 1, wherein the first through-substrate via and second through-substrate via are arranged for being electrically connected in pairs.

3. The device according to claim 1, wherein the at least one first through-substrate via is configured to drive the test circuit.

4. The device according to claim 1, wherein the at least one second through-substrate via is configured to capture signals from the test circuit.

5. The device according to claim 1, wherein the at least one first through-substrate via is configured to capture signals from the test circuit.

6. The device according to claim 1, wherein the at least one second through-substrate via is configured to drive the test circuit.

7. The device according to claim 1, wherein an electrical connection between the first through-substrate via and the second through-substrate via is made outside the first die.

8. The device according to claim 1, wherein the at least one second through-substrate via is electrically connected to the at least one first through-substrate via by a seed layer and/or plated metal between the first and the second through-substrate vias.

9. The device according to claim 1, wherein the at one second through-substrate via is electrically connected to the at least one first through-substrate via by a direct Cu—Cu bond.

10. The device according to claim 1, wherein the connection between the at least one first through-substrate via and the at least one second through-substrate via comprises micro-bumps.

11. A 3D chip stack comprising:
    a first die and a second die, the first die comprising a first electrical circuit and the second die comprising a second electrical circuit,
    wherein the first die further comprises at least one first through-substrate via for providing electrical connection between the first electrical circuit and the second electrical circuit, a test circuit and at least one second through-substrate via electrically connected between the at least one first through-substrate via and the test circuit, the electrical connection between the at least one first through-substrate via and the at least one second through-substrate via being made outside the second die, the first and the second through-substrate vias being electrically connected to each other so as to form a feedback loop from the test circuit back to the test circuit, the feedback loop comprising at least the first and the second through-substrate vias and the test circuit.

12. The 3D chip stack according to claim 11, wherein the at least one second through-substrate via is electrically connected to the at least one first through-substrate via by a seed layer and/or plated metal between the first and the second through-substrate vias.

13. The 3D chip stack according to claim 11, wherein the at one second through-substrate via is electrically connected to the at least one first through-substrate via by a direct Cu—Cu bond.

14. The 3D chip stack according to claim 11, wherein the connection between the at least one first through-substrate via and the at least one second through-substrate via comprises micro-bumps.

15. The 3D chip stack according to claim 11, wherein the first through-substrate via and second through-substrate via are arranged for being electrically connected in pairs.

16. Use of a 3D chip stack according to claim 11, wherein in a test mode the at least one second through-substrate via acts as a feedback through-substrate via, while in a functional mode the at least one second through-substrate via acts as a backup through-substrate via.

17. A method of testing a through-substrate via in a 3D chip stack comprising a first die and a second die, the first die comprising at least one first through-substrate via for providing electrical connection between a first electrical circuit in the first die and a second electrical circuit in the second die, the first die further comprising a second through-substrate via for each first through-substrate via to be tested, the method comprising:
    applying an input test signal to one of the first through-substrate via and the second through-substrate via, the first and second through-substrate vias being electrically connected outside the second die, the first and the second through-substrate vias being electrically connected to each other so as to form a feedback loop from a test circuit back to the test circuit, the feedback loop comprising at least the first and the second through-substrate vias and the test circuit; and
    sensing an output test signal from the other of the first through-substrate via and the second through-substrate via.

18. A system for testing a through-substrate via in a 3D chip stack comprising a first die and a second die, the first die comprising at least one first through-substrate via for providing electrical connection between a first electrical circuit in the first die and a second electrical circuit in the second die, the first die further comprising a second through-substrate via for each first through-substrate via to be tested, the system comprising:
    means for applying an input test signal to one of the first through-substrate via and the second through-substrate via, the first and second through-substrate vias being electrically connected outside the second die, the first and the second through-substrate vias being electrically connected to each other so as to form a feedback loop from a test circuit back to the test circuit, the feedback loop comprising at least the first and the second through-substrate vias and the test circuit; and
    means for sensing an output test signal from the other of the first through-substrate via and the second through-substrate via.

* * * * *

UNITED STATES PATENT AND TRADEMARK OFFICE
CERTIFICATE OF CORRECTION

PATENT NO.       : 8,593,170 B2                      Page 1 of 1
APPLICATION NO.  : 12/891658
DATED            : November 26, 2013
INVENTOR(S)      : Geert Van der Plas et al.

It is certified that error appears in the above-identified patent and that said Letters Patent is hereby corrected as shown below:

In the Specification

Col. 3, line 43, please change "an an" to --an--.

Col. 7, line 39, please change "tri-stabeable" to --tri-stateable--.

Col. 10, line 4, please change "such at" to --such that the at--.

In the Claims

Col. 11, line 44, Claim 9, please change "at one" to --at least one--.

Col. 12, lines 9-10, Claim 13, please change "at one" to --at least one--.

Signed and Sealed this
Twenty-sixth Day of August, 2014

Michelle K. Lee
*Deputy Director of the United States Patent and Trademark Office*